United States Patent
Yao et al.

(10) Patent No.: US 8,507,988 B2
(45) Date of Patent: Aug. 13, 2013

(54) HIGH VOLTAGE DEVICES, SYSTEMS, AND METHODS FOR FORMING THE HIGH VOLTAGE DEVICES

(75) Inventors: Chih-Wen Yao, Hsinchu (TW); Robert S. J. Pan, Guishan Township (TW); Ruey-Hsin Liu, Hsinchu (TW); Hsueh-Liang Chou, Jhubei (TW); Puo-Yu Chiang, Su-ao Township (TW); Chi-Chih Chen, Hsinchu (TW); Hsiao Chin Tuan, Judong County (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 323 days.

(21) Appl. No.: 12/792,055

(22) Filed: Jun. 2, 2010

(65) Prior Publication Data

US 2011/0079846 A1 Apr. 7, 2011

Related U.S. Application Data

(60) Provisional application No. 61/248,098, filed on Oct. 2, 2009.

(51) Int. Cl.
*H01L 29/66* (2006.01)

(52) U.S. Cl.
USPC .... 257/343; 257/211; 257/335; 257/E29.027; 257/E29.256; 257/E21.417; 438/618

(58) Field of Classification Search
USPC ................ 438/618; 257/335, 343, E29.027, 257/E29.256, E21.417
See application file for complete search history.

(56) References Cited

U.S. PATENT DOCUMENTS

| | | | |
|---|---|---|---|
| 6,969,901 B1 | 11/2005 | Pan et al. | |
| 7,208,364 B2 | 4/2007 | Pan et al. | |
| 7,235,451 B2 | 6/2007 | Hao et al. | |
| 2005/0118764 A1* | 6/2005 | Chou et al. | 438/275 |
| 2006/0231905 A1* | 10/2006 | Roedle et al. | 257/392 |
| 2007/0278568 A1* | 12/2007 | Williams et al. | 257/335 |
| 2008/0265417 A1* | 10/2008 | Kawamura et al. | 257/751 |
| 2009/0072308 A1* | 3/2009 | Chen et al. | 257/336 |
| 2010/0295126 A1* | 11/2010 | Ito | 257/343 |

* cited by examiner

*Primary Examiner* — Daniel Whalen
*Assistant Examiner* — Aaron Dehne
(74) *Attorney, Agent, or Firm* — Lowe Hauptman Ham & Berner, LLP

(57) ABSTRACT

A high voltage (HV) device includes a gate dielectric structure over a substrate. The gate dielectric structure has a first portion and a second portion. The first portion has a first thickness and is over a first well region of a first dopant type in the substrate. The second portion has a second thickness and is over a second well region of a second dopant type. The first thickness is larger than the second thickness. A gate electrode is disposed over the gate dielectric structure. A metallic layer is over and coupled with the gate electrode. The metallic layer extends along a direction of a channel under the gate dielectric structure. At least one source/drain (S/D) region is disposed within the first well region of the first dopant type.

17 Claims, 9 Drawing Sheets

HIGH VOLTAGE DEVICES, SYSTEMS, AND METHODS FOR FORMING THE HIGH VOLTAGE DEVICES

CROSS-REFERENCE TO RELATED APPLICATIONS

The present application claims priority of U.S. Provisional Patent Application Ser. No. 61/248,098, filed on Oct. 2, 2009, which is incorporated herein by reference in its entirety.

TECHNICAL FIELD

The present disclosure relates generally to the field of semiconductor circuits, and more particularly, to high voltage devices, systems, and methods for forming the high voltage devices.

BACKGROUND

The demand for evermore compact, portable, and low cost consumer electronic devices has driven electronics manufacturers to develop and manufacture integrated circuits (IC) that operate with low power supply voltages resulting in low power consumption. There may be components of the devices that require higher voltages than the low power supply voltage. For example, liquid crystal display (LCD) drivers may use high voltage (HV) MOS transistors for driving pixels of LCD.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1A:
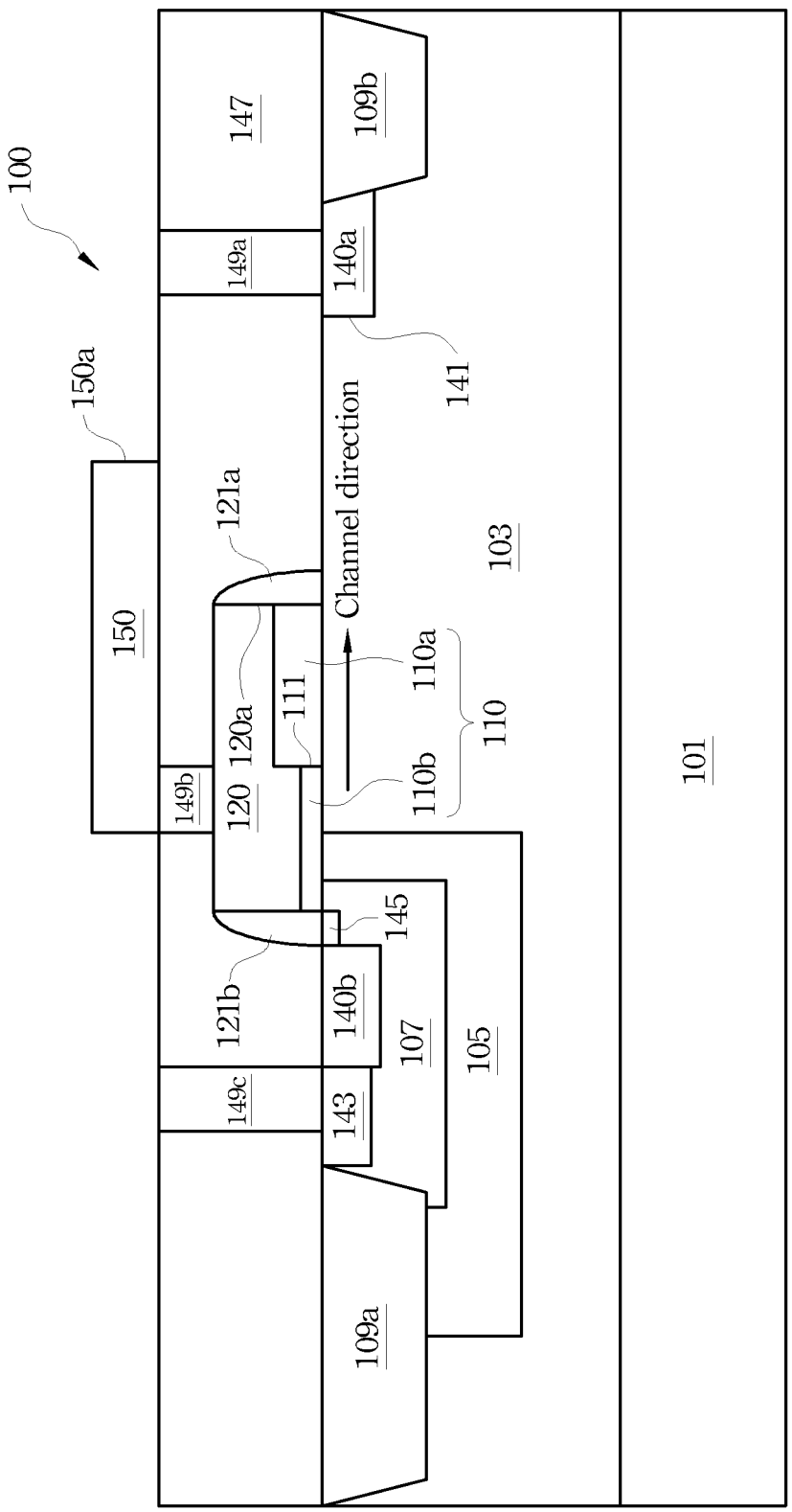
FIG. 1A is a schematic cross-sectional view of an exemplary high voltage (HV) device.

A conventional HV MOS transistor has an isolation structure, e.g., a shallow trench isolation (STI) structure or a local oxidation of silicon (LOCOS) structure, under a gate electrode of the conventional HV device. The conventional HV device having the isolation structure under the gate electrode can have a desired breakdown voltage. Conventionally, the STI structure or the LOCOS structure has a thickness of about thousands of angstroms.

A laterally diffused MOS (LDMOS) transistor has a single core oxide layer below a gate electrode. To achieve a desired drain-to-source breakdown voltage, a drain of the conventional LDMOS transistor is distant from an interface between a high voltage p-type well (HVPW) and a high voltage n-type well (HVNW). Due to the distance of the drain and the interface, a chip size of an integrated circuit using the conventional LDMOS transistor is thus increased. Additionally, the dopant concentration of the drain is lowered to enhance the drain-to-source breakdown voltage. It is found that a drain-to-source on state resistance $RDS_{on}$ of the conventional LDMOS transistor is increased.

Based on the foregoing, HV devices, systems, and methods for forming the HV devices are desired.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a schematic cross-sectional view of an exemplary high voltage (HV) device. In FIG. 1A, a HV device 100 can include a well region 103 of a first dopant type, e.g., n-type dopant, in or over a substrate 101. In some embodiments, the HV device 100 can be referred to as a HV laterally diffused MOS (HV LDMOS) transistor, a HV extended drain MOS (HV EDMOS) transistor, or other HV device.

In some embodiments, the substrate 101 can include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

The well region 103 can be referred to as a high-voltage well region, e.g., a HV N-type well (HVNW) region. In some embodiments, the well region 103 can have a dopant type opposite to that of the substrate 101. In some other embodiments, the well region 103 can have a dopant concentration that is higher than that of the substrate 101.

Referring to FIG. 1A, the HV device 100 can include a well region 105. The well region 105 can be disposed within the well region 103. In embodiments using an N-type HV device, the well region 105 can have a p-type dopant that is opposite to that of the well region 103. In some other embodiments, the well region 105 can be referred to as a high-voltage well region, e.g., a HV P-type well (HVPW) region.

Referring to FIG. 1A, the HV device 100 can include a body region 107. The body region 107 can be disposed within the well region 105. In embodiments using an N-type HV device, the body region 107 can have a p-type dopant that is opposite to that of the well region 103. In some embodiments, a body contact region 143 can be disposed in the body region 107. The body contact region 143 can have the same dopant type as the body region 107. The body contact region 143 can provide an electrical connection for the body region 107. It is noted that the locations of the well regions 103, 105, the body region 107, and/or the body contact region 143 described above are merely exemplary. One of skill in the art can modify them to achieve a desired HV device.

In some embodiments, at least one isolation structure, e.g., isolation structures 109a and 109b, can be disposed in the well region 103 for isolating the HV device 100 from other device (not shown). The isolation structures 109a and 109b can include a structure of a local oxidation of silicon (LOCOS), a shallow trench isolation (STI) structure, and/or any suitable isolation structure.

Referring to FIG. 1A, the HV device 100 can include a gate dielectric structure 110. The gate dielectric structure 110 can have a first portion, e.g., a portion 110a, and a second portion, e.g., a portion 110b. The portion 110a can be disposed over the well region 103. The portion 110b can be disposed over the well region 105. The portion 110a can have a thickness that is larger than that of the second portion 110b. In some embodiments, the portion 110a can have a thickness between about 300 Å and about 1,000 Å. In some other embodiment, the portion 110b can be referred to as a core dielectric layer. The core dielectric layer can have a thickness ranging from about several to about tens of angstroms.

In some embodiments, each of the portions 110a and 110b of the gate dielectric structure 110 can be a single layer or a multi-layer structure. In embodiments for multi-layer structures, the gate dielectric structure 110 can include an interfacial layer and a high dielectric constant (high-k) dielectric layer. The interfacial layer can include dielectric material such as, silicon oxide, silicon nitride, silicon oxinitride, other dielectric material, and/or the combinations thereof. The high-k dielectric layer can include high-k dielectric materials such as $HfO_2$, HfSiO, HfSiON, HfTaO, HfTiO, HfZrO, other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof.

In some embodiments, the portions 110a and 110b can have an interface 111. The first portion 110a can be completely over the well region 103. The second portion 110b can be over both of the well regions 103 and 105. The interface 111 can be over the well region 103. In some other embodiments, the interface 111 can be substantially adjacent to an interface between the well regions 103 and 105. In still other embodiments, the interface 111 can be over the well region 105.

Referring to FIG. 1A, the HV device 100 can include a gate electrode 120. The gate electrode 120 can be disposed over the gate dielectric structure 110. The gate electrode 120 can have an edge 120a. In some embodiments, the gate electrode 120 can include polysilicon, silicon-germanium, a metallic material including metal compounds such as, Mo, Cu, W, Ti, Ta, TiN, TaN, NiSi, CoSi, and/or other suitable conductive materials known in the art. In some other embodiments, the gate electrode 120 can include a work function metal layer such that it provides an N-metal work function or P-metal work function of a metal gate. P-type work function materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

In some embodiments, spacers 121a and 121b can be disposed on sidewalls of the gate electrode 120. The spacers 121a and 121b can include at least one material, e.g., oxide, nitride, oxynitride, other dielectric material, or any combinations thereof.

Referring to FIG. 1A, the HV device 100 can include at least one source/drain (S/D) region, e.g., a drain region 140a and a source region 140b. The drain region 140a can be disposed in the well region 103. The source region 140b can be disposed in the body region 107. The drain region 140a can have an edge 141. In some embodiments, the HV device 100 is free from including any isolation structure, e.g., STI structure or LOCOS structure, between the gate electrode 120 and the drain region 140a. In some other embodiments, the HV device 100 can include an isolation structure (not shown), e.g., STI structure or LOCOS structure, at least partially under the gate electrode 120. The isolation structure can desirably enhance a gate-to-drain breakdown voltage of the HV device 100.

In some embodiments, the drain region 140a and the source region 140b can include dopants. For embodiments forming N-type HV device, the drain region 140a and the source region 140b can have dopants such as Arsenic (As), Phosphorus (P), other group V element, or any combinations thereof. For embodiments forming P-type HV device, the drain region 140a and the source region 140b can have dopants such as boron (B), other group III element, or any combinations thereof.

In some embodiments, each of the drain region 140a and the source region 140b can include a silicide structure (not shown). The silicide structure may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof.

In some embodiments, the HV device 100 can include a lightly doped drain (LDD) region 143 disposed adjacent to the source region 140b. For embodiments forming N-type HV device, the LDD region 143 can have dopants such as Arsenic (As), Phosphorus (P), other group V element, or any combinations thereof. For embodiments forming P-type HV device, the LDD region 143 can have dopants such as boron (B), other group III element, or any combinations thereof.

Referring to FIG. 1A, at least one dielectric layer, e.g., a dielectric layer 147 can be disposed over the gate electrode 120. The dielectric layer 147 may include materials such as silicon oxide, silicon nitride, silicon oxynitride, one or more low dielectric constant (low-k) dielectric materials, one or more ultra low-k dielectric materials, or any combinations thereof. In some embodiments, at least one interconnect structure, e.g., contact plugs 149a-149c, disposed within the dielectric layer 147. The contact plugs 149a-149c can be electrically coupled with the drain region 140a, the gate electrode 120, and the source region 140b, respectively. The contact plugs 149a-149c can include materials such as tungsten, aluminum, copper, titanium, tantalum, titanium nitride, tantalum nitride, nickel silicide, cobalt silicide, other proper conductive materials, and/or combinations thereof.

Referring to FIG. 1A, the HV device 100 can include a metallic layer 150 over the gate electrode 120. The metallic layer 150 can be coupled with the gate electrode 120 through, for example, the contact plug 149b. In some embodiments, the metallic layer 150 can be referred to as a metal 1 (M1) layer.

As noted, the metallic layer 150 can extend along a direction of a channel under the gate dielectric structure 110. In some embodiments, the metallic layer 150 can have an edge 150a. The edge 150a of the metallic layer 150 can be between the edge 120a of the gate electrode 120 and the edge 141 of the drain region 140a. In some other embodiments, the edge 150a of the metallic layer 150 can be closer to the edge 141 of the drain region 140a than to the edge 120a of the gate electrode 120.

In some embodiments, the metallic layer 150 can have a portion (not shown) extending in a direction that is substantially perpendicular to the channel direction. The portion of the metallic layer 150 can provide a connection with other metallic layers (not shown) formed over the metallic layer 150. The metallic layer 150 can include materials such as tungsten, aluminum, copper, titanium, tantalum, titanium nitride, tantalum nitride, nickel silicide, cobalt silicide, other proper conductive materials, and/or combinations thereof.

Figure 1B:
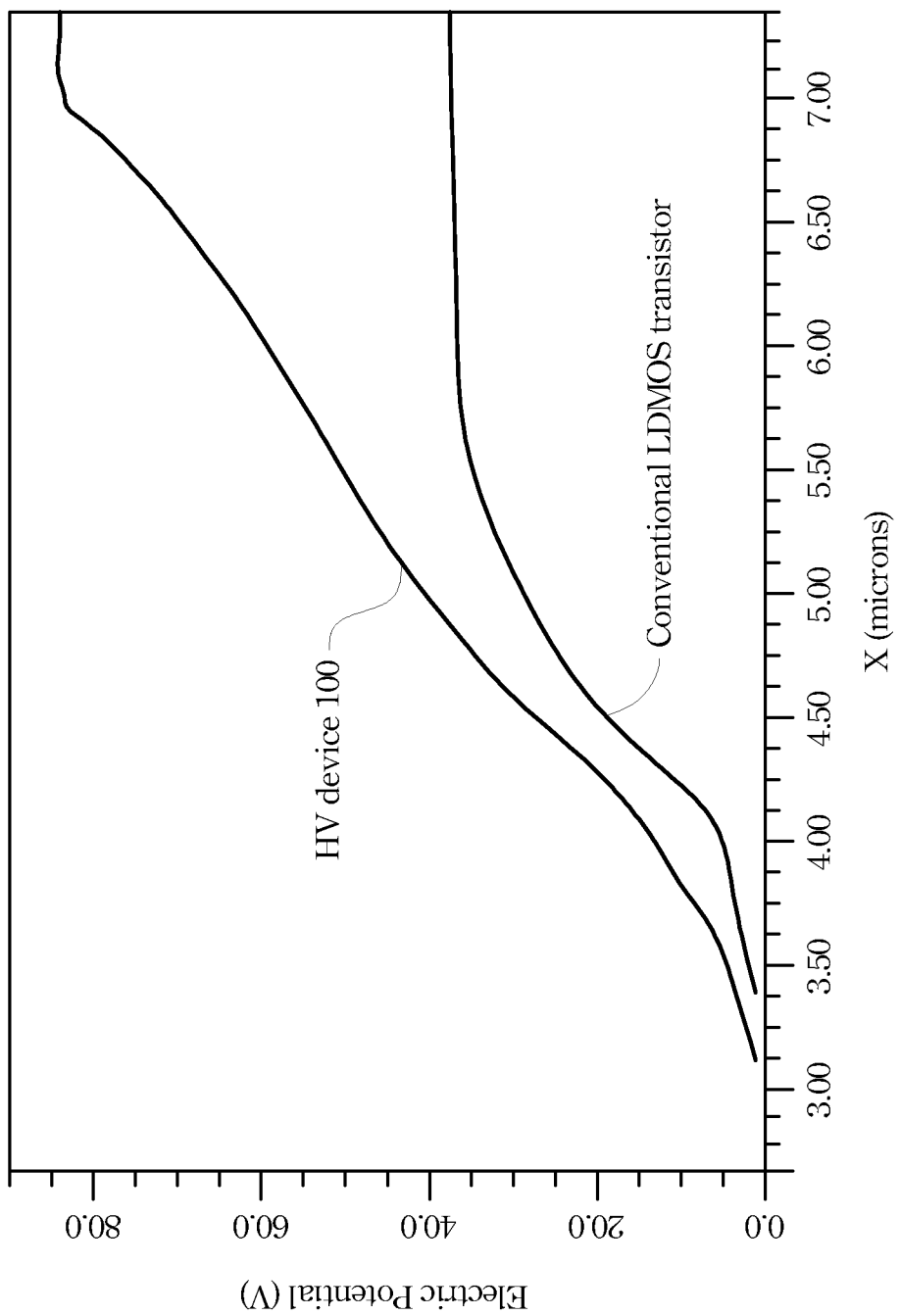
FIG. 1B is a drawing illustrating simulation results of breakdown voltages of the conventional laterally diffused MOS (LDMOS) transistor and an exemplary HV device.

As noted, the thickness of the portion 110a can be larger than a core oxide layer and the metallic layer 150 can horizontally extend in the channel direction. It is found that the portion 110a of the gate dielectric structure 110 and the metallic layer 150 can desirably enhance a drain-to-source breakdown voltage of the HV device 100. FIG. 1B is a drawing illustrating simulation results of breakdown voltages of the conventional LDMOS transistor and the HV device 100. In FIG. 1B, the conventional LDMOS transistor has a drain-to-source breakdown voltage of about 35 V. The HV device 100 can have a drain-to-source breakdown voltage of about 83 V. The drain-to-source breakdown voltage of the HV device 100 is substantially higher than that of the conventional LDMOS transistor.

As noted, the portion 110a of the gate dielectric structure 110 and the metallic layer 150 can enhance the drain-to-source breakdown voltage of the HV device 100. The distance between the drain region 140a and the interface of the regions 103 and 105 of the HV device 100 can be desirably reduced. By reducing the distance, an integrated circuit using the HV device 100 can have a desired size. Compared with an integrated circuit using the conventional LDMOS transistor, the integrated circuit using the HV device 100 is smaller.

Figure 2:
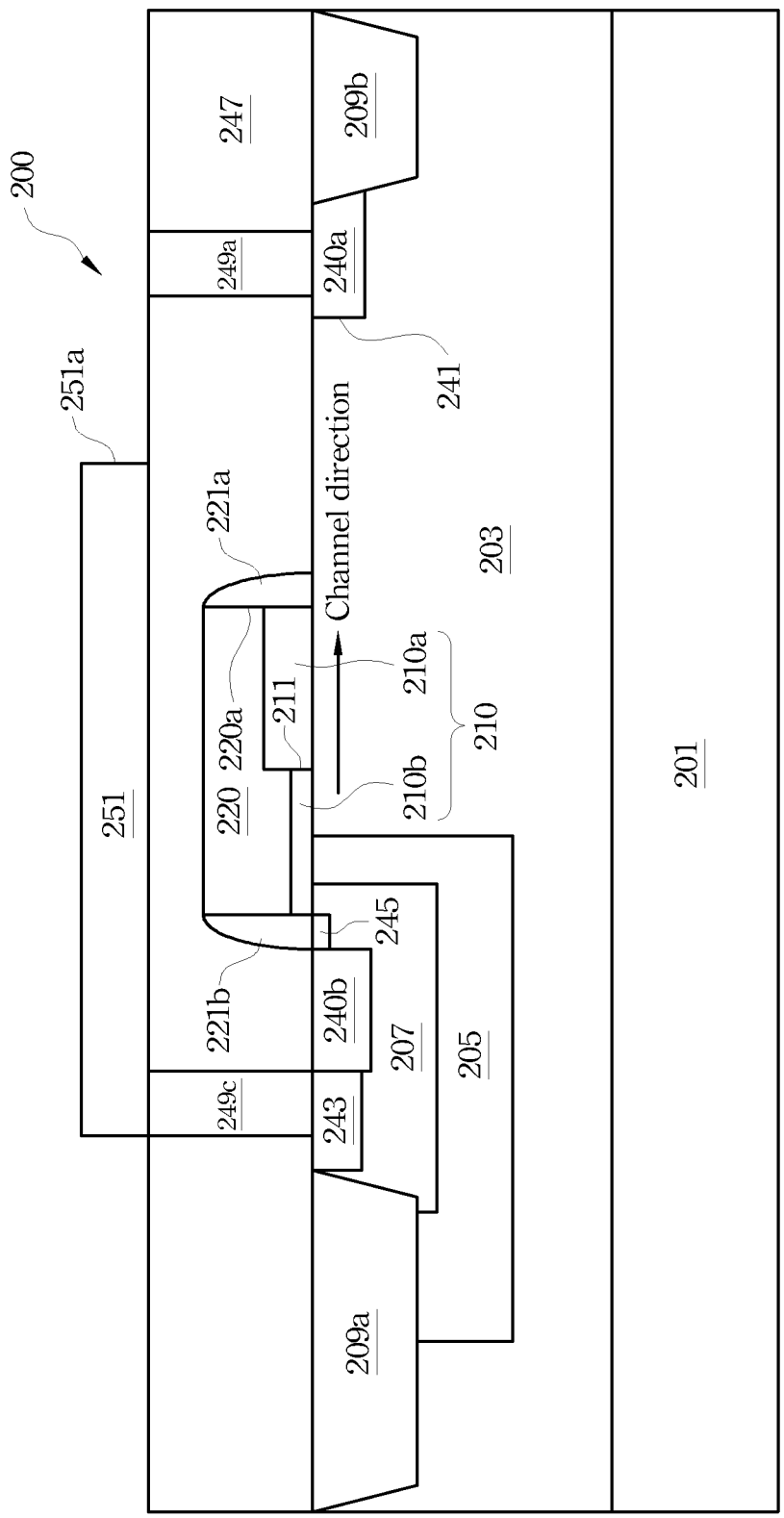
FIG. 2 is a schematic cross-sectional view of another exemplary high voltage (HV) device.

FIG. 2 is a schematic cross-sectional view illustrating another exemplary HV device. Items of the HV device 200 in FIG. 2 that are the same items of the HV device 100 in FIG. 1A are indicated by the same reference numerals, increased by 100. Referring to FIG. 2, the HV device 200 can include a metallic layer 251. The metallic layer 251 can be coupled with the source region 240b through the contact plug 249c. In some other embodiments, the metallic layer 251 can be coupled with the drain region 240a through the contact plug 249a. The metallic layer 251 can be referred to as a metal 1 (M1) layer.

As noted, the metallic layer 251 can extend along a direction of a channel under the gate dielectric structure 210. In some embodiments, the metallic layer 251 can have an edge 251a. The edge 251a of the metallic layer 251 can be between the edge 220a of the gate electrode 220 and the edge 241 of the drain region 240a. In some other embodiments, the edge 251a of the metallic layer 251 can be closer to the edge 241 of the drain region 240a than the edge 220a of the gate electrode 220.

In some embodiments, the metallic layer 251 can have a portion (not shown) extending in a direction that is substantially perpendicular to the channel direction. The portion of the metallic layer 251 can provide a connection with other metallic layers (not shown) formed over the metallic layer 251. The metallic layer 251 can include materials such as tungsten, aluminum, copper, titanium, tantalum, titanium nitride, tantalum nitride, nickel silicide, cobalt silicide, other proper conductive materials, and/or combinations thereof.

FIGS. 3A-3E are schematic cross-sectional views showing an exemplary method for forming an exemplary HV device. Items of the HV device 300 formed by the method in FIGS. 3A-3E that are the same items of the HV device 100 in FIG. 1A are indicated by the same reference numerals, increased by 200. In some embodiments, the method for forming the HV device 300 can be modified to form the HV device 200 described above in conjunction with FIG. 2.

Figure 3A:
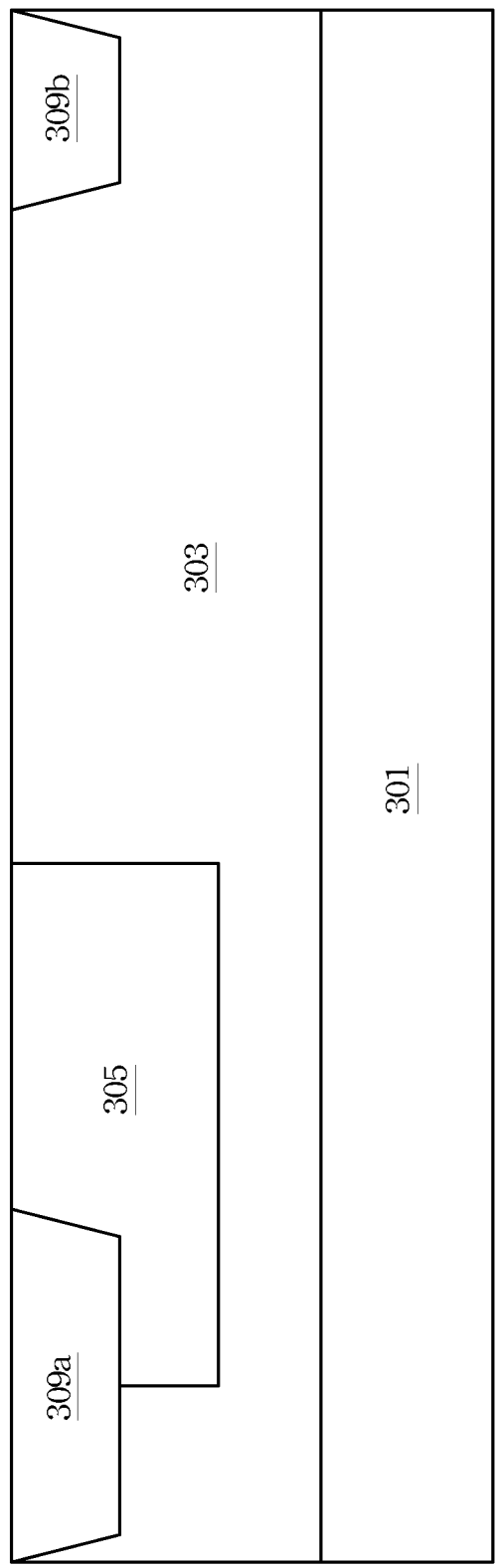
FIGS. 3A-3E are schematic cross-sectional views showing an exemplary method for forming an exemplary HV device.

In FIG. 3A, a well region 303 can be formed over or within a substrate 301. A well region 305 can be formed within the well region 303. Isolation structures 309a and 309b can be formed within the well region 303. In some embodiments, the well regions 303 and 305 can be formed by any suitable process, such as ion implantation and/or a rapid thermal process (RTP) to activate the doped regions. The isolation structures 309a and 309b can be formed by, for example, a STI process, a LOCOS process, and/or other suitable method for forming isolation structures. As one example, the formation of an STI may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Figure 3B:
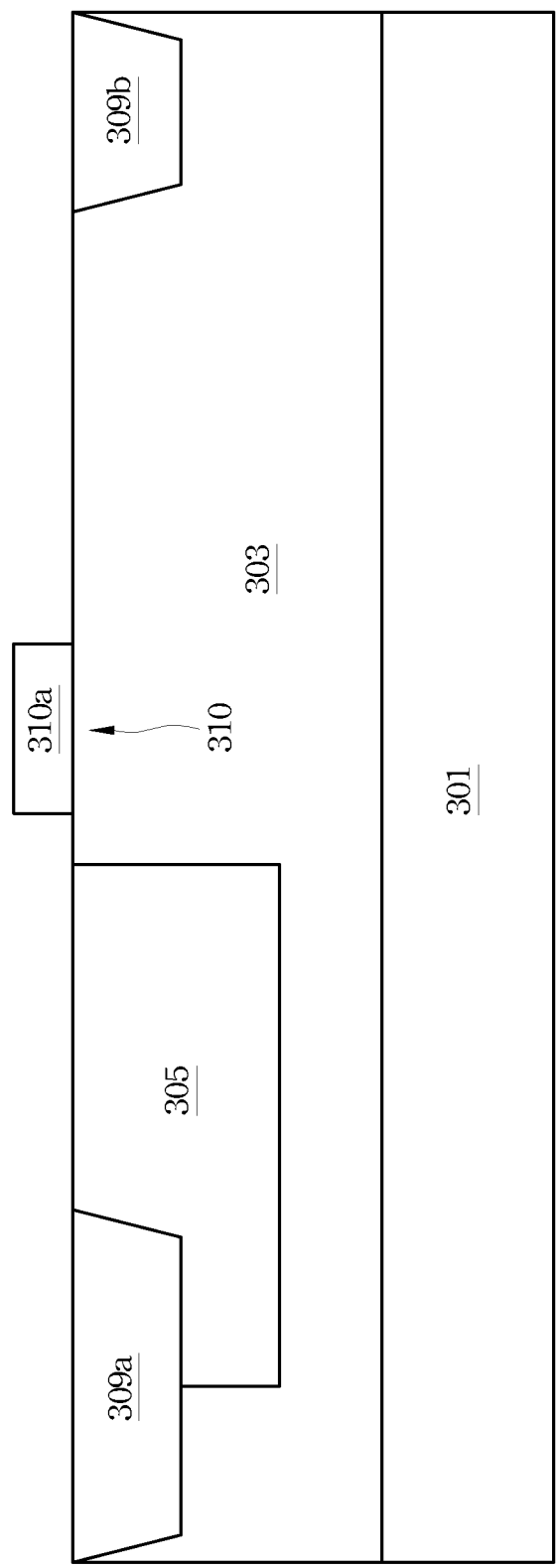

In FIG. 3B, a portion 310a of a gate dielectric structure 310 can be formed over the well region 303. The portion 310a of the gate dielectric structure 310 may be formed by any suitable process, such as atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof.

Figure 3C:
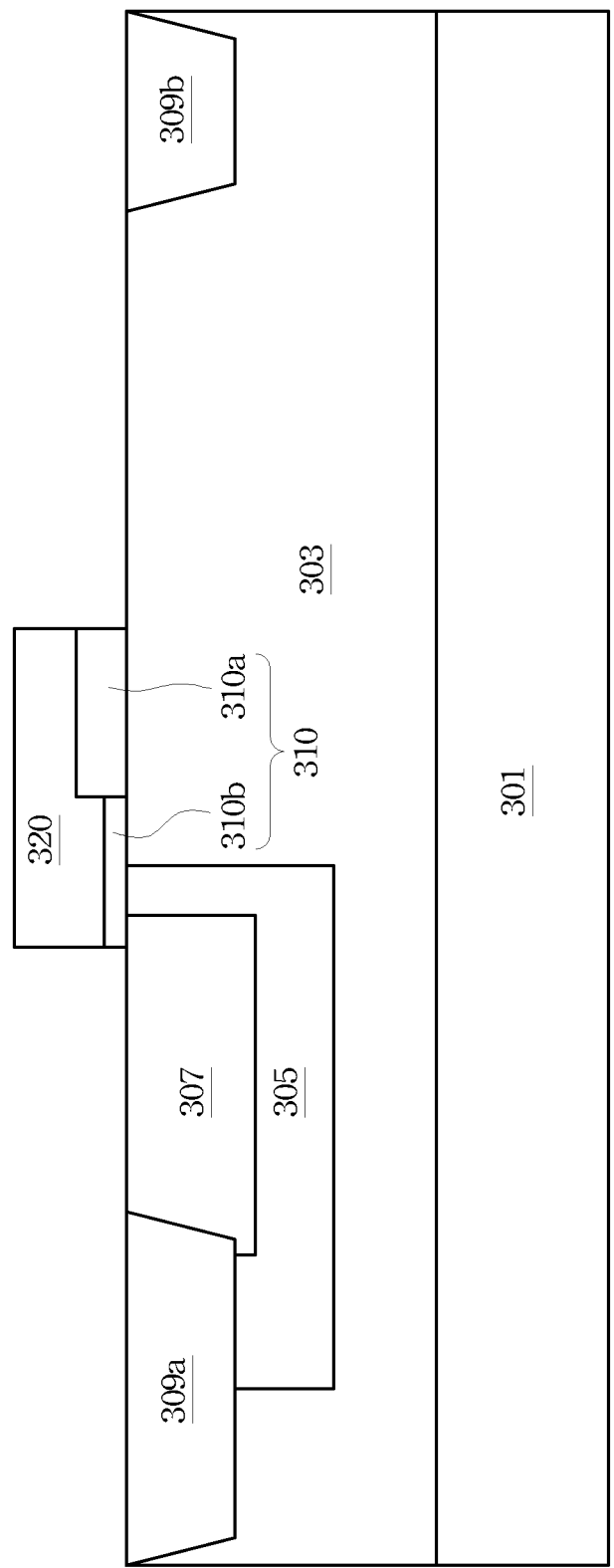

In FIG. 3C, a body region 307 can be formed within the well region 305. The body region 307 can be formed by any suitable process, such as ion implantation and/or a rapid thermal process (RTP) to activate the doped regions.

Another portion 310b of the gate dielectric structure 310 can be formed over the well region 305. As noted, in some embodiments, the portion 310b can be thinner than the portion 310a. The portion 310b of the gate dielectric structure 310 may be formed by any suitable process, such as atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof.

It is noted that the sequence and/or processes for forming the portions 310a and 310b described above in conjunction with FIGS. 3B and 3C are merely exemplary. The scope of the invention is not limited thereto. In some embodiments, the portion 310b can be formed before the formation of the portion 310a. For example, a first dielectric material can be formed over the substrate 301 in both regions of the portions 310a and 310b. A second dielectric material can be formed over the first dielectric material only in the region of the portion 310a. The thickness of the first dielectric material can be equal to the thickness of the portion 310b. The sum of the thicknesses of the first and second dielectric materials can be equal to the thickness of the portion 310a.

Referring to FIG. 3C, a gate electrode 320 can be formed over the gate dielectric structure 310. The gate electrode 320 can be formed by any suitable process, such as atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof. In some embodiments, a silicide structure can be formed over the gate electrode 320. The salicidation process may react a deposited metallic material and the gate electrode at an elevated temperature that is selected based on the specific material or materials. This is also referred to as annealing, which may include a RTP. The reacted silicide may require a one step RTP or multiple step RTPs.

Figure 3D:
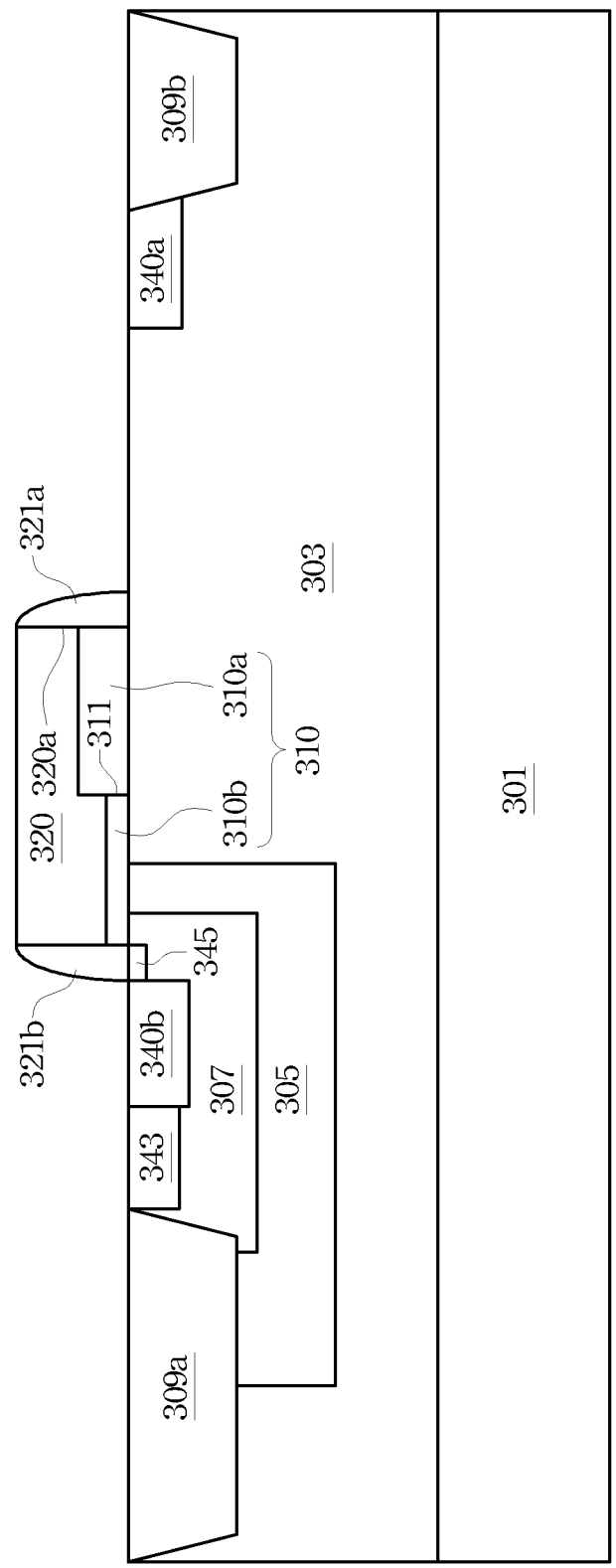

In FIG. 3D, spacers 321a and 321b can be formed on sidewalls of the gate electrode 320. The spacers 321a and 321b may be formed by depositing a dielectric material by CVD, ALD, PVD, and/or other suitable processes and then etching.

A drain region 340a, a source region 340b, and/or a LDD region 345 can be formed by any suitable process, such as ion implantation and/or a rapid thermal process (RTP) to activate the doped regions. A body contact region 343 can be formed within the body region 307. The body contact region 343 can be formed by any suitable process, such as ion implantation and/or a rapid thermal process (RTP) to activate the doped regions.

Figure 3E:
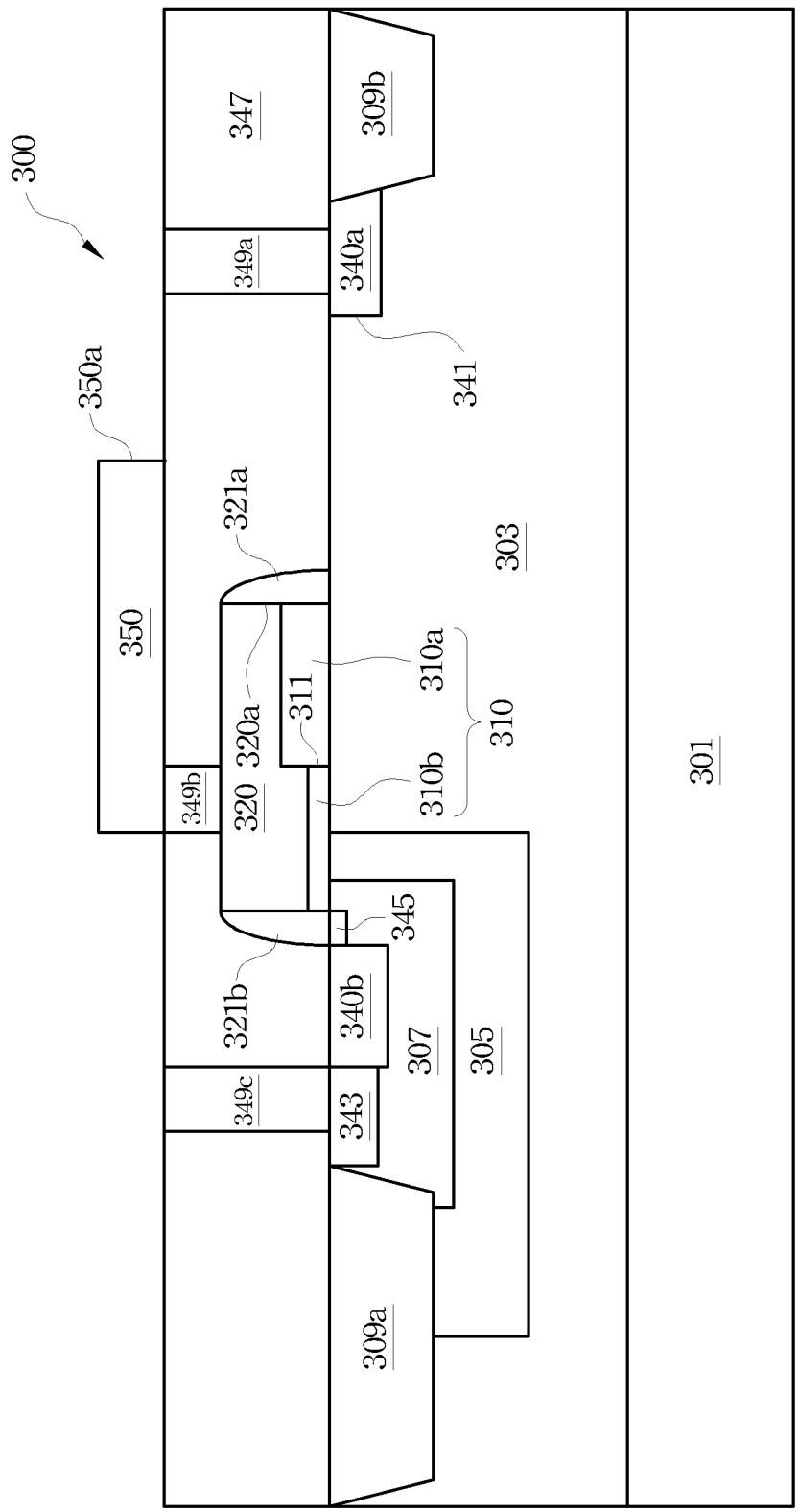

In FIG. 3E, a dielectric layer 347 can be formed over the gate electrode 320. The dielectric layer 347 may be formed by depositing a dielectric material by CVD, ALD, PVD, and/or other suitable processes. Contact plugs 349a-349c can be formed within the dielectric layer 347. The contact plugs 349a-349c can be formed by, for example, patterning the dielectric layer 347 by a photolithography process, etching contact holes in the dielectric layer 347 (for example, by using a dry etching, wet etching, and/or plasma etching process), and filling the trench (for example, by using a chemical vapor deposition process) with at least one metallic material.

A metallic layer 350 can be formed over the dielectric layer 347. The metallic layer 350 can be formed by, for example, depositing a metallic material by CVD, ALD, PVD, and/or suitable processes over the dielectric layer 347. A photolithographic process and etch process can be performed to pattern the metallic material, defining the metallic layer 350. In some embodiments, the photolithographic process and etch process can define an edge 350a of the metallic layer 350 between an edge 341 of the drain region 340a and an edge 320a of the gate electrode 320. In some other embodiments, the photolithographic process and etch process can define the edge 350a of the metallic layer 350 closer to the edge 341 of the drain region 340a than to the edge 320a of the gate electrode 320.

In some embodiments, dielectric materials, via plugs, metallic regions, and/or metallic lines can be formed over the metallic layer 350 for interconnection. The via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The via plugs, metallic regions, and/or metallic lines can be formed by any suitable processes, such as deposition, photolithography, and etching processes, and/or combinations thereof.

In some embodiments, the method described above in conjunction with FIGS. 3A-3E is free from including forming an isolation structure, e.g., STI structure or LOCOS structure, between the gate electrode 320 and the drain region 340a. In some other embodiments, the method can include forming a STI structure or LOCOS structure at least partially below the gate electrode 320. It is noted that the sequence and/or processes of the method described above in conjunction with FIGS. 3A-3E are merely exemplary. The scope of the invention is not limited thereto.

Figure 4:
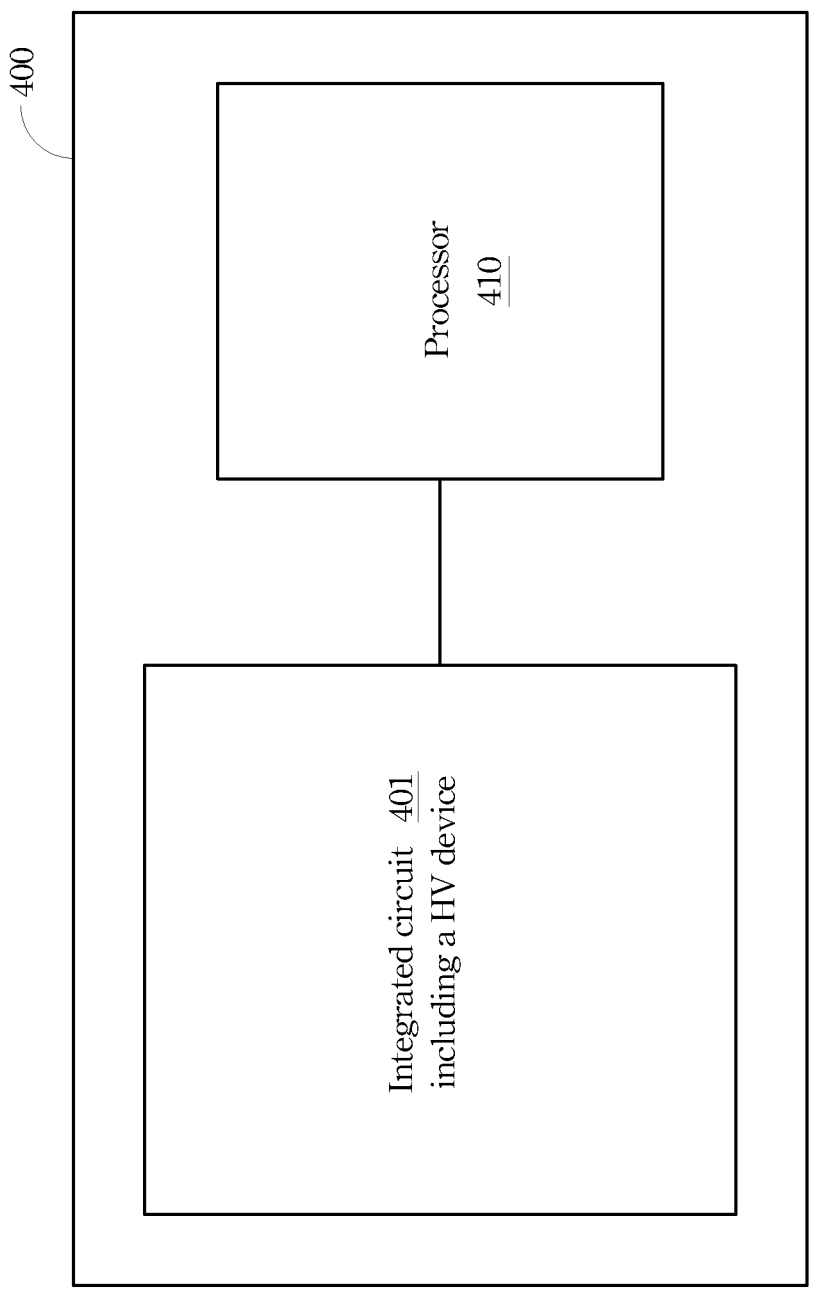
FIG. 4 is a schematic drawing showing a system including an exemplary integrated circuit.

FIG. 4 is a schematic drawing showing a system including an exemplary integrated circuit. In FIG. 4, a system 400 can include a processor 410 coupled with an integrated circuit 401. The integrated circuit 401 can be a LCD driver, radio frequency (RF) circuit, RF power amplifier, or other circuit that uses the HV device 100 or 200 described above in conjunction with FIG. 1A or FIG. 2, respectively. The processor 410 can be a processing unit, central processing unit, digital signal processor, or other processor that is suitable for accessing data of memory circuit.

In some embodiments, the processor 410 and the integrated circuit 401 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system 400 including the integrated circuit 401 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high voltage (HV) device comprising:
   a gate dielectric structure over a substrate, the gate dielectric structure having a first portion and a second portion, the first portion having a first thickness and being over a first well region of a first dopant type in the substrate, the second portion having a second thickness and being over a second well region of a second dopant type, the first thickness being larger than the second thickness;

a gate electrode disposed over the gate dielectric structure;

a dielectric layer directly on at least a portion of an upper surface of the gate electrode;

a metallic layer directly on the dielectric layer and electrically coupled with the gate electrode, the metallic layer extending along a direction of a channel under the gate dielectric structure; and at least one source/drain (S/D) region disposed within the first well region of the first dopant type, wherein the metallic layer has a first edge, the gate electrode has a second edge, and the at least one S/D region has a third edge, the first edge is directly over a gap region defined by the second edge and the third edge, and the gate electrode and the at least one S/D region are positioned outside the gap region.

2. The HV device of claim 1, wherein the first thickness ranges between about 300 Å and about 1,000 Å.

3. The HV device of claim 1, wherein the first edge is closer to the third edge than to the second edge.

4. The HV device of claim 1, wherein the first portion and the second portion has an interface and the interface is over the first well region of the first dopant type.

5. The HV device of claim 1, wherein the HV device is free from including any isolation structure between the gate electrode and the at least one S/D region.

6. A high voltage (HV) device comprising:
a gate dielectric structure over a substrate, the gate dielectric structure having a first portion and a second portion, the first portion having a first thickness and being over a first well region of a first dopant type in the substrate, the second portion having a second thickness and being over a second well region of a second dopant type, the first thickness being larger than the second thickness;

a gate electrode disposed over the gate dielectric structure;

at least one source/drain (S/D) region disposed within the second well region;

another S/D region within the first well region; and a metallic layer electrically coupled with the at least one S/D region, the metallic layer overlapping the gate electrode and extending along a direction of a channel under the gate dielectric structure, wherein the metallic layer has a first edge, the gate electrode has a second edge, and the another S/D region has a third edge, the first edge is directly over a gap region defined by the second edge and the third edge, the gate electrode and the another S/D region are positioned outside the gap region, and the first edge is closer to the third edge than to the second edge.

7. The HV device of claim 6, wherein the first thickness ranges between about 300 Å and about 1,000 Å.

8. The HV device of claim 6, wherein the first portion and the second portion has an interface and the interface is over the first well region of the first dopant type.

9. The HV device of claim 6, wherein the HV device is free from including any isolation structure between the gate electrode and the another S/D region.

10. A method for forming a high voltage (HV) device, the method comprising:
forming a gate dielectric structure over a substrate, the gate dielectric structure having a first portion and a second portion, the first portion having a first thickness and being over a first well region of a first dopant type in the substrate, the second portion having a second thickness and being over a second well region of a second dopant type, the first thickness being larger than the second thickness;

forming a gate electrode over the gate dielectric structure;

forming a source/drain (S/D) region within the first well region;

forming a dielectric layer directly on at least a portion of an upper surface of the gate electrode; and forming a metallic layer directly on the dielectric layer and electrically coupled with the gate electrode, the metallic layer overlapping the gate electrode and extending along a direction of a channel under the gate dielectric structure, wherein an edge of the metallic layer is directly over a gap region defined by an edge of the gate electrode and an edge of the S/D region, and the gate electrode and the S/D region are positioned outside the gap region.

11. The method of claim 10, wherein forming the gate dielectric structure comprises:
forming the first portion of the gate dielectric structure; and
forming the second portion of the gate dielectric structure, wherein forming the first portion and forming the second portion are separate processes.

12. The method of claim 11, wherein forming the gate dielectric structure further comprises:
forming an interface between the first portion and the second portion, wherein and the interface is over the first well region of the first dopant type.

13. The method of claim 10, wherein the first thickness ranges between about 300 Å and about 1,000 Å.

14. The method of claim 10, wherein the edge of the metallic layer is closer to the edge of the S/D region than to the edge of the gate electrode.

15. The method of claim 10, wherein the method is free from including forming any isolation structure between the S/D region and the gate electrode.

16. The HV device of claim 6, further comprising:
a dielectric layer directly on at least a portion of an upper surface of the gate electrode, and the metallic layer being directly on the dielectric layer.

17. The method of claim 10, further comprising forming another S/D region within the second well region.

* * * * *